(12) United States Patent
Yokoyama

(10) Patent No.: US 9,345,133 B2
(45) Date of Patent: May 17, 2016

(54) PRINTED CIRCUIT BOARD AND METHOD OF MOUNTING COMPONENTS ON THE PRINTED CIRCUIT BOARD

(71) Applicant: CANON KABUSHIKI KAISHA, Tokyo (JP)

(72) Inventor: Junnosuke Yokoyama, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 64 days.

(21) Appl. No.: 14/362,390

(22) PCT Filed: Feb. 13, 2013

(86) PCT No.: PCT/JP2013/054059
§ 371 (c)(1),
(2) Date: Jun. 2, 2014

(87) PCT Pub. No.: WO2013/129193
PCT Pub. Date: Sep. 6, 2013

(65) Prior Publication Data
US 2014/0318850 A1    Oct. 30, 2014

(30) Foreign Application Priority Data

Feb. 28, 2012    (JP) .................................. 2012-042384

(51) Int. Cl.
| | |
|---|---|
| *H05K 1/11* | (2006.01) |
| *H05K 3/40* | (2006.01) |
| *H05K 1/02* | (2006.01) |
| *H05K 3/34* | (2006.01) |

(52) U.S. Cl.
CPC .............. *H05K 1/0296* (2013.01); *H05K 1/111* (2013.01); *H05K 3/34* (2013.01); *H05K 3/3436* (2013.01); *H05K 3/4007* (2013.01); *H05K 1/0271* (2013.01); *H05K 3/3484* (2013.01); *H05K 2201/094* (2013.01); *H05K 2203/043* (2013.01); *H05K 2203/0465* (2013.01); *H05K 2203/0485* (2013.01); *Y02P 70/611* (2015.11); *Y02P 70/613* (2015.11); *Y10T 29/49149* (2015.01)

(58) Field of Classification Search
CPC ....... H05K 1/111; H05K 1/112; H05K 1/113; H05K 3/4007; H05K 3/4015
See application file for complete search history.

(56) References Cited

U.S. PATENT DOCUMENTS

| | | | | |
|---|---|---|---|---|
| 8,178,392 B2* | 5/2012 | Choi et al. | ..................... | 438/108 |
| 8,546,954 B2* | 10/2013 | Kwon et al. | ................... | 257/777 |
| 2003/0235043 A1* | 12/2003 | Yoshida | ....................... | 361/760 |

FOREIGN PATENT DOCUMENTS

| | | |
|---|---|---|
| JP | 10-107176 A | 4/1998 |
| JP | 11-238960 A | 8/1999 |
| JP | 2006-332385 A | 12/2006 |
| JP | 2007-109933 A | 4/2007 |
| JP | 2009-10257 A | 1/2009 |
| JP | 2011-103398 A | 5/2011 |

* cited by examiner

*Primary Examiner* — Jeremy C Norris
(74) *Attorney, Agent, or Firm* — Fitzpatrick, Cella, Harper & Scinto

(57) ABSTRACT

A printed circuit board on which a component having a plurality of terminals is to be mounted by using a reflow soldering process, includes wiring patterns that are arranged in correspondence with the plurality of terminals and have a size which is smaller in wiring patterns for terminals near the central portion of the component than in wiring patterns for terminals near each end portion of the component.

7 Claims, 7 Drawing Sheets

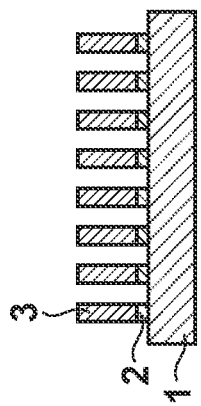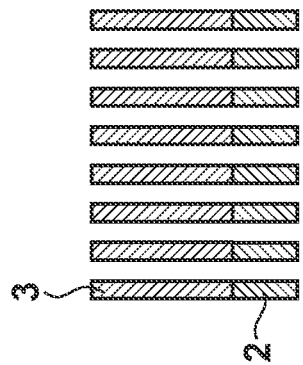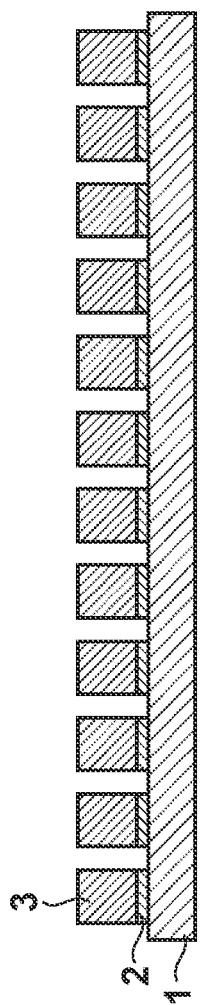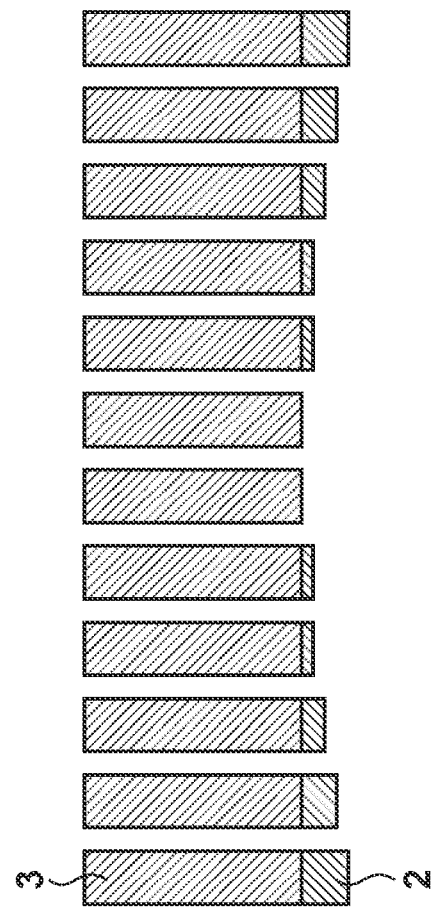

PRINTED CIRCUIT BOARD AND METHOD OF MOUNTING COMPONENTS ON THE PRINTED CIRCUIT BOARD

TECHNICAL FIELD

The present invention relates, for example, to a printed circuit board on which a multi-pin component with a large outer shape and a component having terminals with narrow pitches are mounted by using a reflow soldering process, and a method of mounting components on the printed circuit board.

BACKGROUND ART

While the terminal pitch of each component, for example, a BGA (Ball Grid Array) or a CSP (Chip Size Package) mounted on a printed circuit board has been reduced, the number of terminals of this component is increasing. Since these components have a large number of terminals, they have large outer shapes. Also, since these components have large outer shapes, they are likely to become nonuniform in internal temperature and are likely to warp upon heating when mounting them on a printed circuit board by using a reflow soldering process. Moreover, these components are made of a plurality of materials, including a mold of a package portion and a metal of a terminal portion, and the components are likely to, for example, warp upon heating and cooling when mounting them, depending on the difference in the thermal expansion coefficient between these plurality of materials.

Nowadays, heating related warping is likely for not only components but also a printed circuit board as well. This is due to the recent tendency to reduce the thickness of a printed circuit board, in order to downsize a via hole, which is effective in terms of routing wiring from a narrow-pitch component, and reducing the area of wirings. On the other hand, as the thickness of a printed circuit board is reduced, the board is more likely to warp.

Although components and a printed circuit board warp upon heating in the conventional cases as well, the rate of occurrence of a problem resulting from warpage of the above-mentioned components and printed circuit board upon mounting components by using a reflow soldering process increases. Conventionally, even if a printed circuit board warps, this problem can be solved by increasing the amount of cream solder. However, due to an increase in number of cases wherein both large components and narrow-pitch components with narrow terminal pitches are mounted on the same printed circuit board, the above-mentioned problem cannot be solved simply by increasing the amount of cream solder. This is because increasing the amount of cream solder to provide an advantage in terms of mounting large components, and decreasing the amount of cream solder to avoid a bridge circuit on mounting narrow-pitch components have a trade-off relationship.

As measures against failures in mounting due to warpage as described above, two approaches are possible. The first approach is to take a measure against the warpage of both components and a printed circuit board. Japanese Patent Laid-Open No. 10-107176, for example, discloses a solder bump forming method of partially changing the ball size in accordance with warpage that has occurred upon the manufacture of a BGA or a CSP to adjust the state of connection by soldering, thereby coping with failures in mounting. This prevents the occurrence of failures in mounting by compensating for the amount of warpage of components by changing the size of a solder ball.

The second approach is to partially increase/decrease the amount of cream solder to be applied onto a printed circuit board to compensate for the amount of warpage.

FIGS. 8A to 8C depict views showing the states of cream solder when mounting a component on a printed circuit board 1 by using the conventional reflow soldering process. Referring to FIGS. 8A to 8C, (a) is a top view of the printed circuit board 1, and (b) is a sectional view of the printed circuit board 1. FIG. 8A shows the printed circuit board 1 before cream solder is applied onto it, and FIG. 8B shows the printed circuit board 1 after cream solder 3 is applied onto it. Conventionally, the cream solder 3 is applied onto a wiring pattern 2 in a length Yb equal to that of the wiring pattern 2 of the printed circuit board 1, and the amount of the cream solder 3 applied is controlled by changing a thickness of a metal mask. In FIG. 8B, the cream solder 3 is applied on the wiring pattern 2 in thickness of h. Note that reference numeral 6 denotes a solder resist. FIG. 8C depicts a view showing the printed circuit board 1 applied with solder 4 (the cream solder 3 has been melted by heating) having a thickness h1 after a reflow soldering process.

To partially increase the amount of the cream solder 3, it is necessary to partially change the thickness of a metal mask, that is, to provide a special metal mask. In contrast to this, Japanese Patent Laid-Open No. 2009-10257, for example, discloses a method of changing the thickness of the land of a corresponding wiring pattern of a printed circuit board to change the thickness of cream solder applied onto the wiring pattern, for each component. This method obviates the need to use a special metal mask, and can therefore prevent a rise in cost, and can densely mount components.

However, the former method of taking a measure against the warpage of components and a printed circuit board is imperfect because the measure cannot cope with a large number of components. The measure against warpage cannot be taken for a large number of components with no solder bumps, such as multi-pin connectors, among components to be mounted on an actual printed circuit board. In addition, printed circuit boards made of materials with high melting points, for example, are commonly used, and the use of these printed circuit boards is effective as a measure against warpage but raises the cost.

Also, the latter method of partially changing the thickness of applied cream solder requires a process of manufacturing a special printed circuit board in which the thicknesses of a part of wiring patterns are changed. Although another method of partially changing the thickness of a metal mask used to print cream solder in place of changing the thicknesses of wiring patterns is known, it raises the cost because the metal mask has a special shape.

Moreover, when narrow-pitch components with narrow terminal pitches and large outer shapes are mounted, it is necessary to change the amount of cream solder applied, in accordance with the positions of terminals in one component.

FIG. 1 is a graph showing the warpage value of a component having multi-pin upon heating, and that of a printed circuit board on which the component is to be mounted, upon heating. FIG. 1 shows the longitudinal direction of the component and printed circuit board on the abscissa, and the amount of warpage on the ordinate.

Referring to FIG. 1, reference numeral 101 denotes warpage of a component, reference numeral 102 denotes warpage of a printed circuit board, and reference numeral 103 denotes the total amount of warpage of the component and printed circuit board. The amounts of warpage of the component and printed circuit board are relatively large in the vicinities of their central portions. In this manner, a component and a printed circuit board often warp in opposite directions, so failures in mounting (solder separation) occur in a component with a large total warpage value, or in portions in the vicinity of the central portion of the board. In the future, such property may pose a serious problem upon mounting a larger number of types of components on a printed circuit board at a higher density.

SUMMARY OF INVENTION

An aspect of the present invention is to eliminate the above-mentioned problems with the conventional technology.

A feature of the present invention is to provide a printed circuit board on which components can be mounted by using a reflow soldering process without a special metal mask, even if the component to be mounted and the printed circuit board have warped, and a method of mounting the same.

According to an aspect of the present invention, there is provided a printed circuit board on which a component having a plurality of terminals is to be mounted by using a reflow soldering process, comprising: wiring patterns that are arranged in correspondence with the plurality of terminals of the component and have a size which is smaller in wiring patterns for terminals near a central portion of the component than in wiring patterns for terminals near each end portion of the component.

According to an aspect of the present invention, there is provided a method of mounting a component having a plurality of terminals on a printed circuit board by using a reflow soldering process, comprising: forming, on a printed circuit board, wiring patterns on which the component is to be mounted, that are arranged in correspondence with the plurality of terminals and have a size which is smaller in wiring patterns for terminals near a central portion of the component than in wiring patterns for terminals near each end portion of the component; applying cream solder onto respective wiring patterns of the printed circuit board in an equal amount regardless of the sizes of the respective wiring patterns; and melting the cream solder by using a reflow soldering process to mount the component on the printed circuit board.

Further features of the present invention will become apparent from the following description of exemplary embodiments with reference to the attached drawings.

BRIEF DESCRIPTION OF DRAWINGS

The accompanying drawings, which are incorporated in and constitute a part of the specification, illustrate embodiments of the invention and, together with the description, serve to explain the principles of the invention.

FIGS. 6A to 6D depict views for explaining the case wherein a component having terminals with a narrower pitch is mounted on the same surface of a printed circuit board having wiring patterns by adjusting dimensions of wiring patterns;

DESCRIPTION OF EMBODIMENTS

Figure 1:
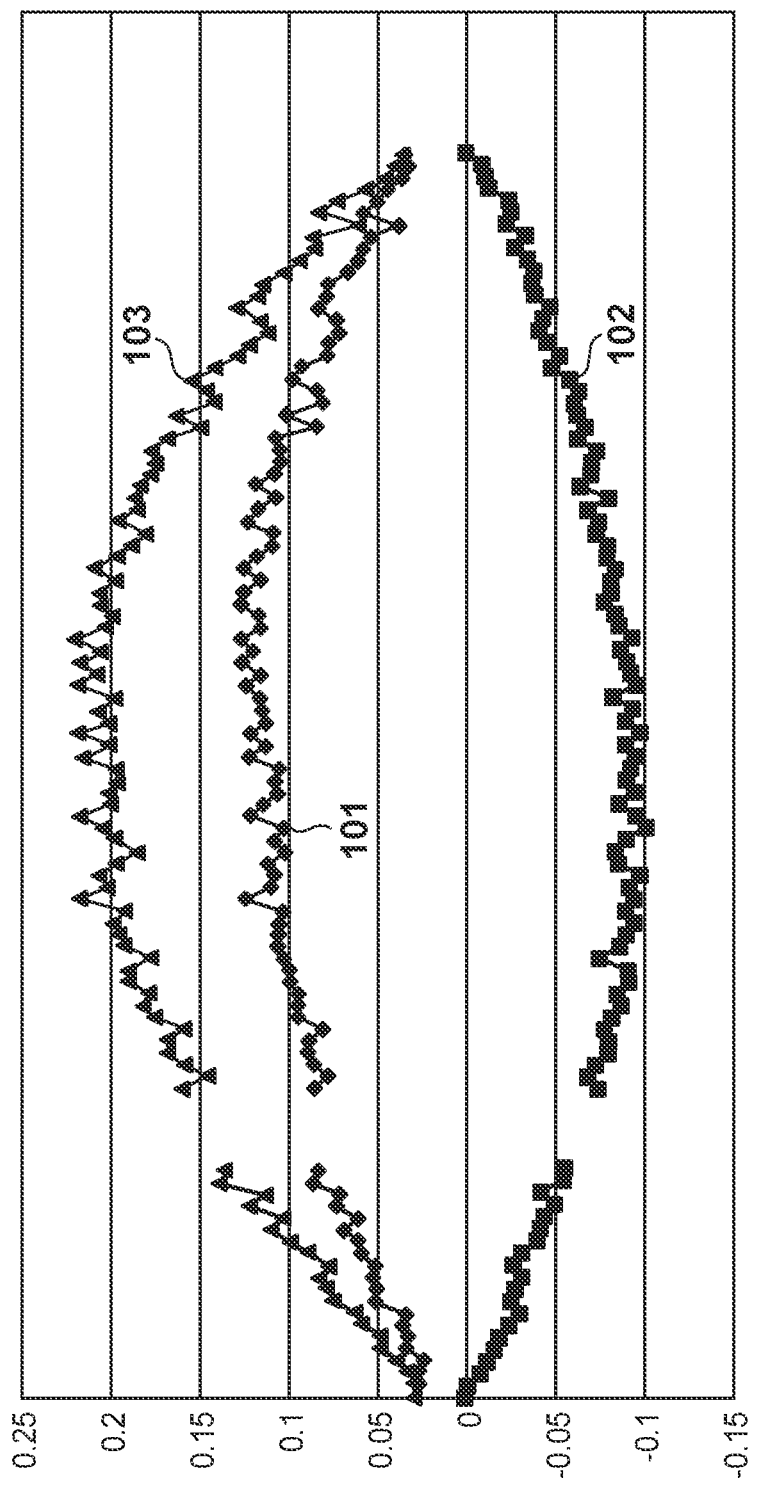
FIG. 1 is a graph showing the warpage value of a component upon heating, and that of a printed circuit board, on which the component is to be mounted, upon heating.

Embodiments of the present invention will be described hereinafter in detail, with reference to the accompanying drawings. It is to be understood that the following embodiments are not intended to limit the claims of the present invention, and that not all of the combinations of the aspects that are described according to the following embodiments are necessarily required with respect to the means to solve the problems according to the present invention. Note that to avoid a repetitive description, the same reference numerals denote the same or equivalent members as or to those described with reference to FIGS. 2A to 7 and 9A to 9C.

Figure 8A:
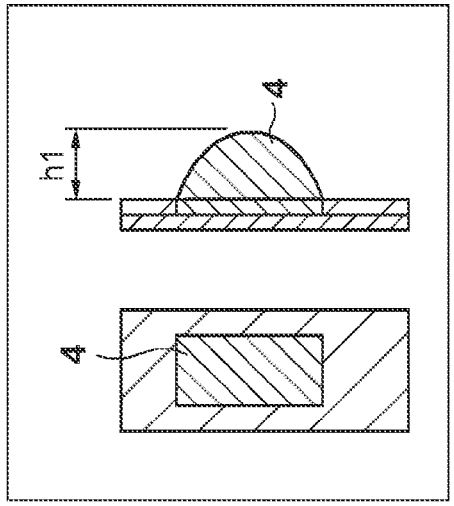
FIGS. 8A to 8C depict views showing the states of solder in the conventional reflow soldering process.
Figure 8B:
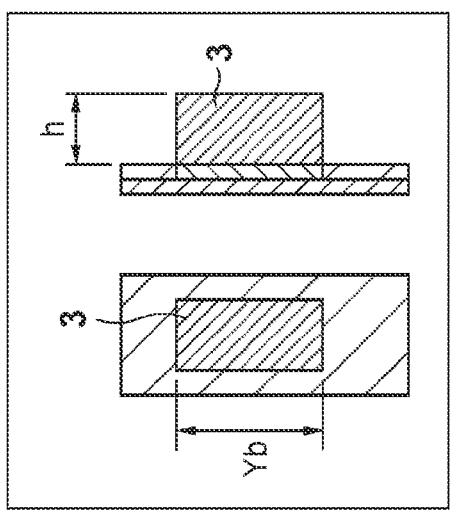
Figure 8C:
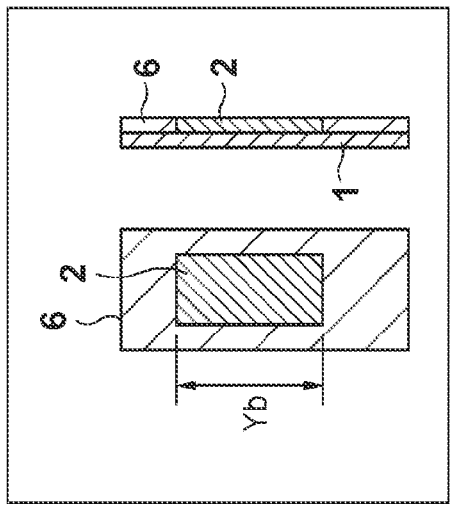
Figure 9A:
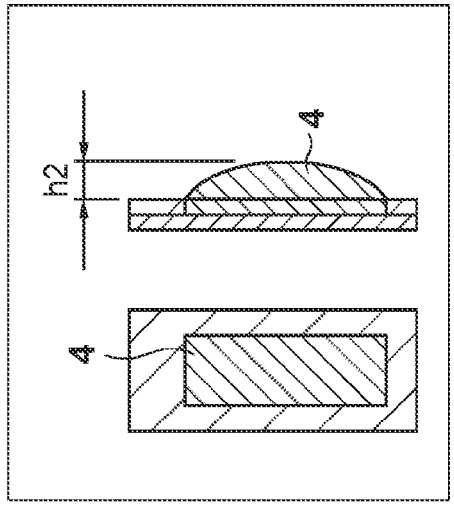
FIGS. 9A to 9C depict views showing the states of solder in a reflow soldering process according to the embodiment of the present invention.
Figure 9B:
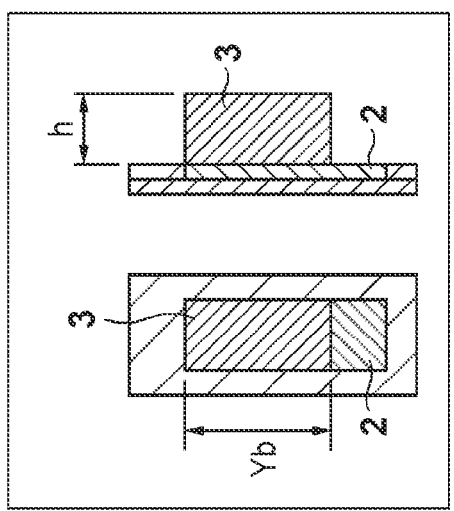
Figure 9C:
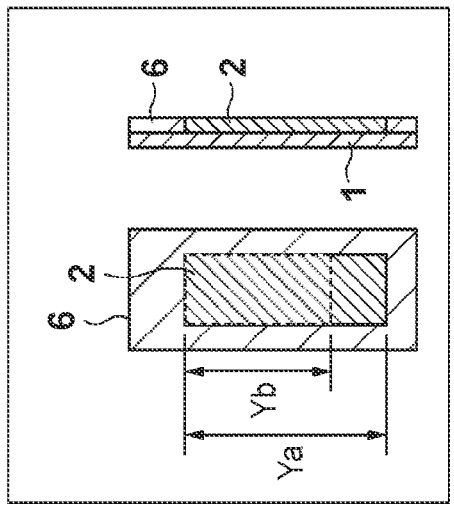

FIGS. 9A to 9C depict views schematically showing the differences in shape of a wiring pattern 2 and in method of applying cream solder 3 between embodiments and the conventional technique shown in FIGS. 8A to 8C, and the basic principle of the embodiments. Referring to FIGS. 9A to 9C as well, (a) depicts a top view of a printed circuit board, and (b) depicts a sectional view of the printed circuit board. In FIG. 9A, a wiring pattern 2 of a printed circuit board 1 according to the embodiment has a length Ya larger than the length Yb of the conventional wiring pattern 2 in FIG. 8A. However, the cream solder 3 is applied onto the wiring pattern 2 in the length Yb, which is equal to that of the conventional cream solder 3, regardless of the difference in length of the wiring pattern 2, as shown in FIG. 9B. During a reflow soldering process, the cream solder 3 melts and spreads over the wiring pattern 2 upon heating, so solder 4 has a shape as shown in FIG. 9C. That is, referring to FIG. 9C, as the cream solder 3 melts and spreads over the entire surface of the wiring pattern 2, therefore the solder 4 spreads to a height h2 lower than a height h1 in the conventional technique shown in FIG. 8C (h2<h1). This embodiment will be described in detail using this principle.

First Embodiment

Figure 2A:
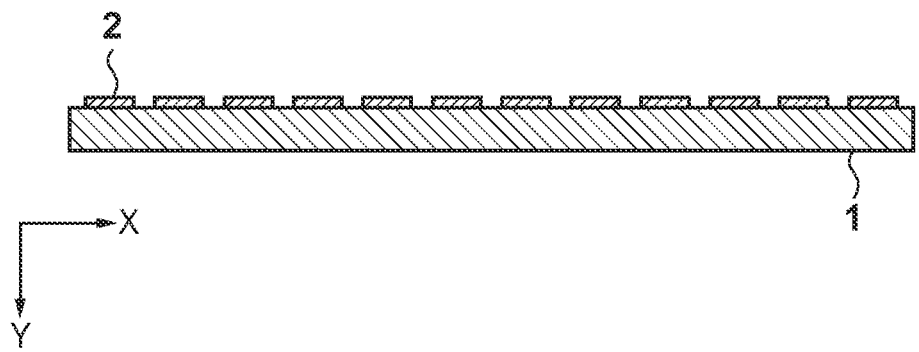
FIG. 2A depicts a sectional view showing the shapes of the wiring patterns of a printed circuit board according to a first embodiment of the present invention.
Figure 2B:
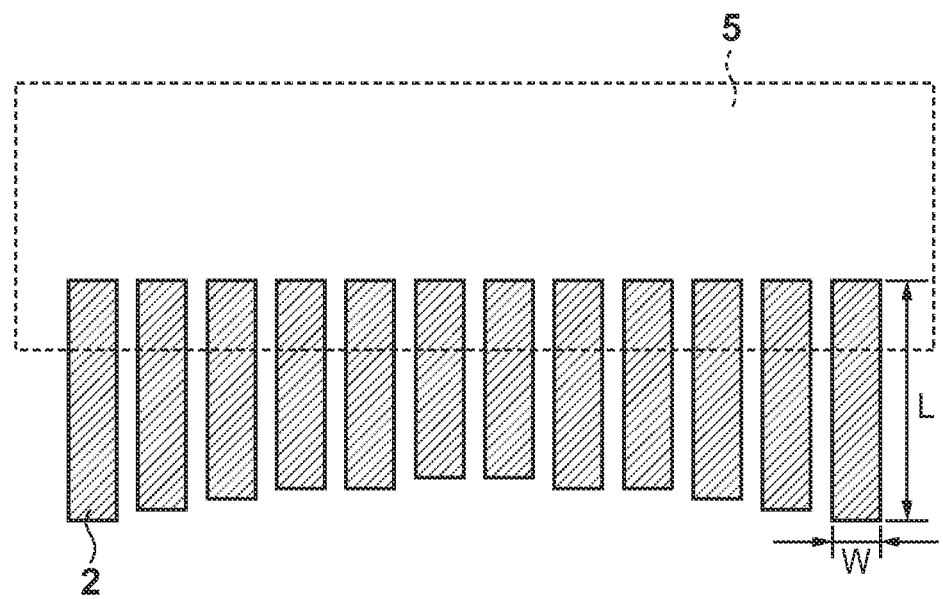
FIG. 2B depicts a top view of the printed circuit board according to the first embodiment.
Figure 3A:
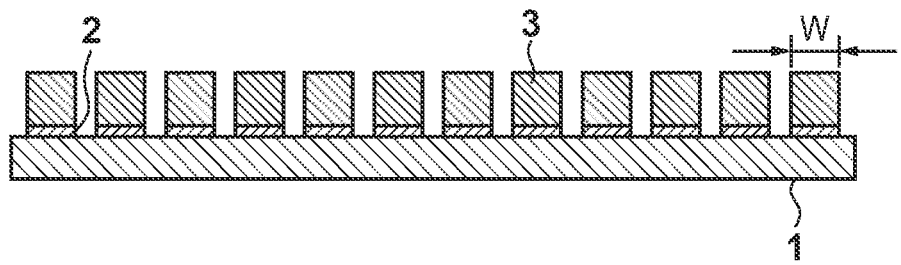
FIG. 3A depicts a sectional view of the printed circuit board, for explaining cream solder to be applied onto the wiring patterns according to the first embodiment.
Figure 3B:
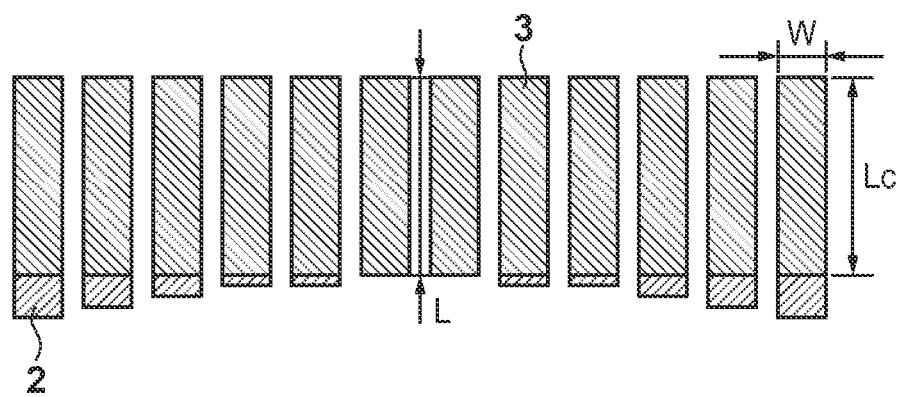
FIG. 3B depicts a top view of the wiring patterns, for explaining the cream solder to be applied onto the wiring patterns according to the first embodiment.
Figure 3C:
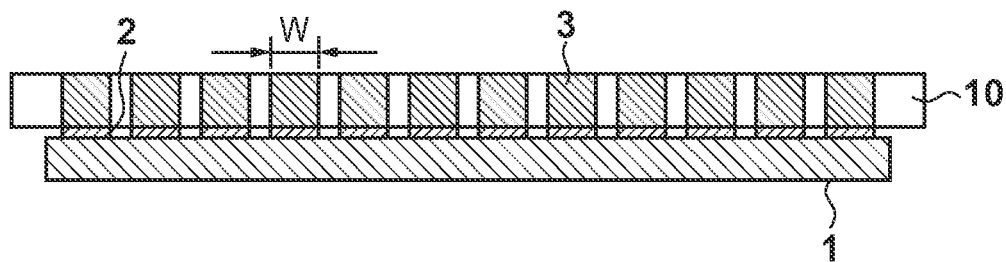
FIG. 3C depicts a view showing the state in which the cream solder is applied onto the printed circuit board.
Figure 4A:
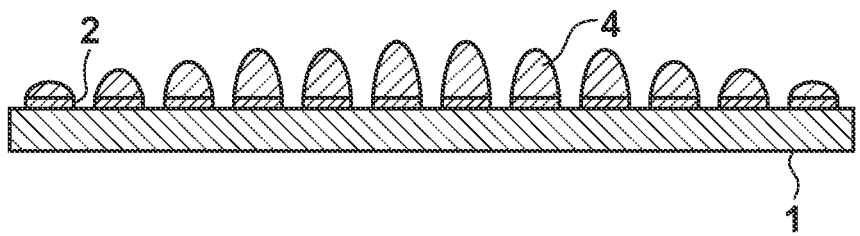
FIG. 4A depicts a sectional view of the printed circuit board, showing the wiring patterns and solder 4 molten by using a reflow soldering process according to the first embodiment.
Figure 4B:
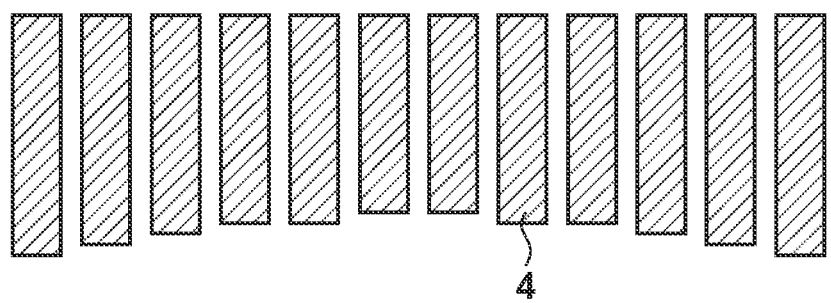
FIG. 4B depicts a top view showing the state in which the solder has been applied onto the wiring patterns according to the first embodiment.

FIGS. 2A and 2B to 4A and 4B show a method of mounting a component on a printed circuit board according to this embodiment. That is, FIGS. 2A and 2B show the state in which wiring patterns 2 are formed on a printed circuit board 1, FIGS. 3A to 3C show the state in which the cream solder 3 is applied onto the wiring patterns 2, and FIGS. 4A and 4B show the state in which the cream solder 3 is molten by using a reflow soldering process.

FIGS. 2A and 2B depict views each showing the shapes of the wiring patterns 2 of a printed circuit board 1 according to the first embodiment of the present invention, in which FIG. 2A depicts a sectional view of the printed circuit board 1, and FIG. 2B depicts a top view of the printed circuit board 1.

Referring to FIG. 2A, the printed circuit board 1 has a feature that the thicknesses of all of a plurality of wiring patterns 2 arranged on the printed circuit board 1 are the same when the printed circuit board 1 is viewed in a sectional view, but the shape of each wiring pattern 2 varies depending on the position of each wiring pattern when viewed from the top of the printed circuit board 1 shown in FIG. 2B. More specifically, first, the width (W) of each wiring pattern 2 in the horizontal direction (X: the terminal pitch direction of a component 5) (to be referred to as a pattern width W hereinafter) is the same. However, the length of each wiring pattern 2 in the vertical direction (Y: a direction perpendicular to the terminal pitch direction of the component 5) (to be referred to as a pattern length L hereinafter) is changed depending on the position of the wiring pattern 2, based on a dimension proportional to the sum (the amount of warpage 103 shown in FIG. 1) of the warpage value of the printed circuit board 1 and that of the component 5. In this example (the amount of warpage 103 shown in FIG. 1), the component 5 and the printed circuit board 1 warp less in the vicinities of the two end portions and more in the vicinity of the central portion, so the pattern length L is relatively large in the vicinities of the two end portions of the component 5 and is relatively small in the vicinity of the central portion. In the wiring patterns 2, the pattern length of each portion with a small total warpage value is extended in the direction away from the component 5 in the vicinities of its two end portions of the component 5, by a dimension proportional to the warpage value with reference to the pattern length of each portion in the vicinity of the central portion, with a largest total amount of warpage of the component 5 and printed circuit board 1. Upon calculating of the actual dimension of each wiring pattern 2, a proportionality coefficient which reflects the composition of solder, the height of cream solder (the thickness of a metal mask), and the width W of each wiring pattern 2 is used.

FIGS. 3A and 3B depict views for explaining a state in which the cream solder 3 is applied onto each wiring pattern 2 according to the first embodiment, in which FIG. 3A depicts a sectional view of the printed circuit board 1, and FIG. 3B depicts a top view showing the state in which the cream solder 3 has been applied onto each wiring pattern 2. FIG. 3C shows the state in which the cream solder 3 is applied onto the printed circuit board 1. Referring to FIG. 3C, a mask pattern 10 is set on the wiring patterns 2 of the printed circuit board 1, and the cream solder 3 is applied onto each wiring pattern 2 through each corresponding opening of the mask pattern 10. Note that each opening of the mask pattern 10 has a pattern width W and a length Lc.

The thicknesses of all applied portions of the cream solder 3 applied on the respective wiring patterns 2 are the same, as shown in FIG. 3A. The widths W and lengths Lc of the cream solder 3 applied onto the respective wiring patterns 2 are the same as well. That is, the mask pattern 10 used to apply the cream solder 3 onto the printed circuit board 1 has the same shape as that of each wiring pattern 2, as shown in FIG. 3C. In the example shown in FIG. 3B, the same amount of cream solder 3 is applied onto all the wiring patterns 2 so that a length (Lc) of the applied cream solder 3 is the same as the pattern length L of the shortest wiring pattern 2 (Lc=L).

Note that the size of each opening of the mask pattern 10 may be set smaller than the shortest wiring pattern 2, and the length Lc of the cream solder 3 applied onto each wiring pattern 2 may be set shorter than the pattern length L of the shortest wiring pattern 2 (Lc<L). However, in this embodiment, it is important to apply the same amount of cream solder 3 onto respective wiring patterns 2.

FIGS. 4A and 4B depict views showing molten solder 4 obtained by executing a reflow soldering process while the cream solder 3 is applied as shown in FIGS. 3A and 3B in the first embodiment, in which FIG. 4A depicts a sectional view of the printed circuit board 1, and FIG. 4B depicts a top view showing the state in which the molten solder 4 is formed on each wiring pattern 2.

Although a component is actually mounted on the printed circuit board 1 by using a reflow soldering process after the component is put on the printed circuit board 1 using a mounter in practice, the component is not mounted in FIGS. 4A and 4B for the sake of simplicity. As shown in FIG. 4A, when a reflow soldering process is performed without mounting any component, it is possible to obtain a cross-section of molten solder 4 with a height, that is lower on the wiring patterns 2 in the vicinities of the two end portions of the component, and higher on the wiring patterns 2 in the vicinity of the central portion, in accordance with dimensions of the wiring patterns 2 of the printed circuit board 1. This is because in the vicinity of the two end portions of the component, the molten solder 4 spreads to portions of the wiring pattern 2, which are not applied with the cream solder 3, and thereby the molten solder 4 spreads over the entire surface of the wiring pattern 2 (FIG. 4B), so the height of the solder 4 lowers.

In this manner, the height of the molten solder 4 can be adjusted in accordance with the shapes (dimension) of the wiring patterns 2 and application of the cream solder 3. With this operation, even if the component and the printed circuit board 1 warp, failures in mounting by a solder separation can be prevented by adjusting the height of the molten solder 4 in accordance with the total amount of their warpage.

Figure 5A:
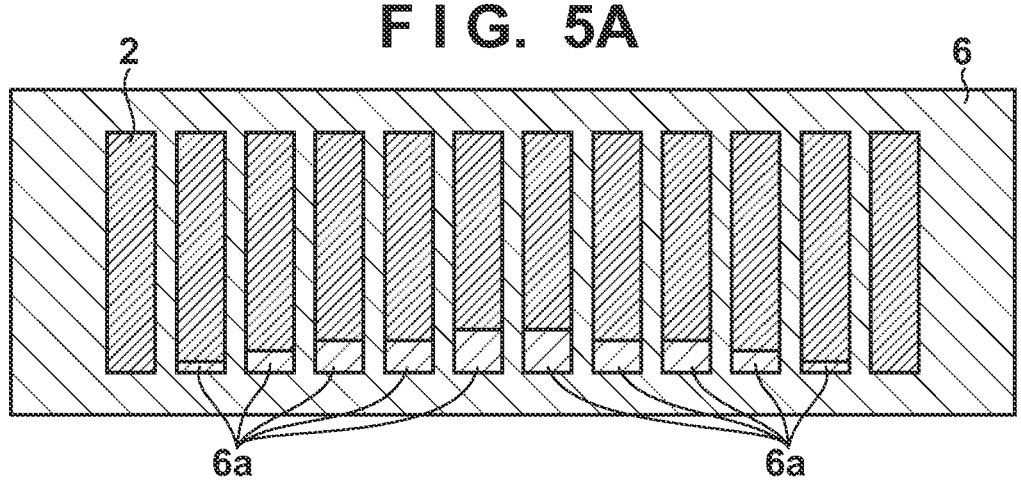
FIGS. 5A and 5B depict views for explaining a method of forming of the wiring patterns according to the first embodiment.
Figure 5B:
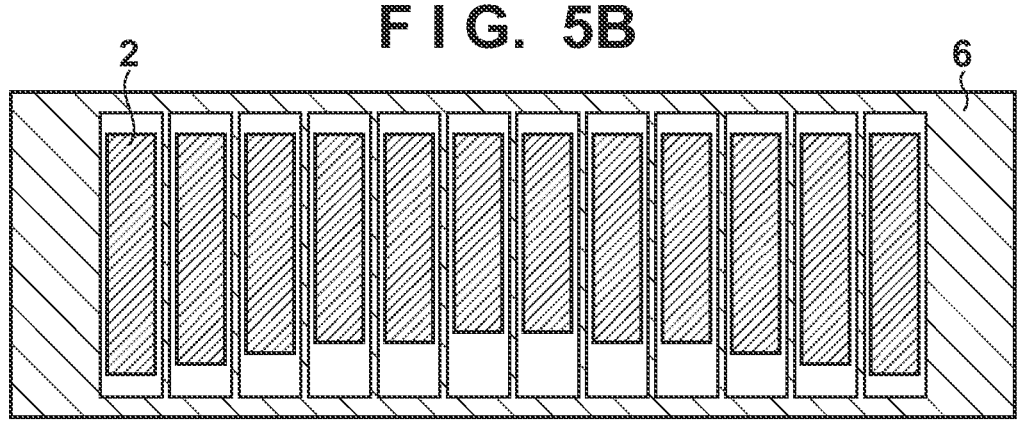

Note that either of methods shown in FIGS. 5A and 5B may be used as a practical method of adjusting the dimensions of the wiring patterns 2. Referring to FIG. 5A, all the wiring pattern 2 have the same length (shape), and the size of each opening in a solder resist 6 formed on the wiring pattern 2 is changed. Referring again to FIG. 5A, reference numeral 6a denotes a portion where the solder resist 6 covers the wiring patterns 2 (a portion where the cream solder 3 is not applied). Alternatively, as shown in FIG. 5B, upon setting the dimensions of the openings in the solder resist 6 to be the same for all the wiring patterns 2, the length of each wiring pattern 2 inside the corresponding opening may be changed.

The case wherein a component having terminals with narrow pitches is mounted on the same surface of the printed circuit board 1 including the wiring patterns 2 having adjusted dimensions, as described above, will be described with reference to FIGS. 6A to 6D.

As in FIGS. 3A and 3B, FIG. 6A depicts a sectional view of the printed circuit board 1, and FIG. 6B depicts a top view showing the state in which the cream solder 3 has been applied onto the wiring patterns 2. The thicknesses of all applied portions of cream solder 3 on the respective wiring patterns 2 are the same, as shown in FIG. 6A. Referring to FIG. 6B, the same amount of cream solder 3 is applied onto respective wiring patterns 2 so that all applied portions of the cream solder 3 have the same length as that of the shortest wiring pattern 2.

FIGS. 6C and 6D depict views for explaining a case in which the cream solder 3 is applied onto respective narrow wiring patterns 2 for a component having terminals with narrow pitches, in which FIG. 6C depicts a sectional view of the printed circuit board 1, and FIG. 6D depicts a top view showing the state in which the cream solder 3 has been applied onto the narrow wiring patterns 2. In this case, the length of each narrow wiring pattern 2 is set longer than that of the cream solder 3 applied. With this operation, even when the cream solder 3 is applied with the same thickness onto respective narrow wiring patterns 2 as in a case that the cream solder 3 is applied on respective wiring patterns each having a width larger than that of the narrow wiring pattern 2, the height of the molten solder 4 on the narrow wiring pattern 2 can be set low, thus preventing generation of a bridge circuit between the narrow wiring patterns 2. This obviates the need to use a special mask pattern in which the cream solder 3 is applied in a thickness that varies between wiring patterns with large widths and wiring patterns with small widths, thus providing an effect of suppressing a rise in manufacturing cost.

Second Embodiment

A method of adjusting the amount (height) of solder by changing the lengths L of the wiring patterns 2 while keeping the widths W of the wiring patterns 2 constant has been described in the first embodiment. In contrast to this, an example in which the amount (height) of solder is adjusted in accordance with widths W and lengths L of wiring patterns 2 will be described in the second embodiment.

Figure 7:
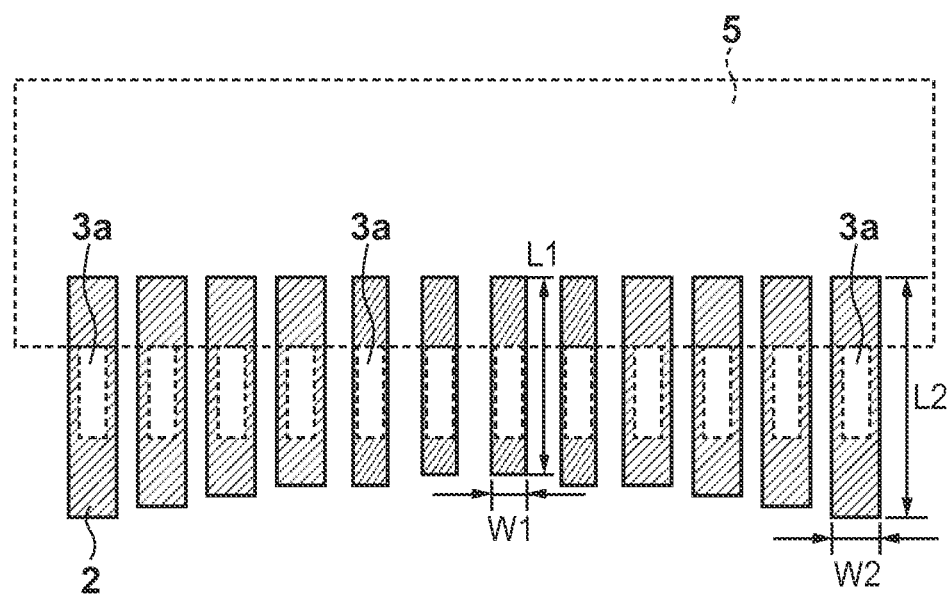
FIG. 7 depicts a view showing the shapes of wiring patterns of a printed circuit board according to a second embodiment of the present invention.

FIG. 7 depicts a view showing the shapes of the wiring patterns of a printed circuit board 1 according to the second embodiment of the present invention.

The product (W×L; size) of the pattern width W and the pattern length L of each wiring pattern 2 may be determined based on the sum of the warpage values, as shown in FIG. 7. That is, the width and length of each wiring pattern 2 in the vicinity of the central portion of a component 5, which has a large warpage value, are set to be W1 and L1, while the width and length of each of wiring patterns 2 in the vicinities of the two end portions of the component 5, which have a small warpage value, are set to be W2 (W1<W2) and L2 (L1<L2). Reference numeral 3a denotes the shape of an opening in a mask pattern 10, to which cream solder 3 is applied. In this case as well, the sizes of the wiring patterns 2 and opening portions 3a are calculated using a proportionality coefficient which reflects the composition of solder, and the height of cream solder (the thickness of a metal mask).

As described above, according to this embodiment, even if a printed circuit board and a component to be mounted have warped, the component can be mounted by using a reflow soldering process, that generates neither solder separation nor bridge circuit, using neither a special substrate manufacturing process nor a special metal mask.

Other Embodiments

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (for example, computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-042384, filed Feb. 28, 2012, which is hereby incorporated by reference herein in its entirety.

The invention claimed is:

1. A printed circuit board on which a component having a plurality of terminals is to be mounted by using a reflow soldering process, comprising:
wiring patterns that are arranged in correspondence with the plurality of terminals of the component and have a size which is smaller in wiring patterns for terminals near a central portion of the component than in wiring patterns for terminals near each end portion of the component,
wherein the wiring patterns for the terminals near each end portion of the component respectively have a larger dimension in a direction perpendicular to a pitch direction than that of the wiring patterns for the terminals near the central portion of the component.

2. The board according to claim 1, wherein the lengths of the wiring patterns are determined in accordance with a warpage value of the component, and a warpage value of the printed circuit board, that occur during the reflow soldering process of the component.

3. The board according to claim 1, wherein an amount of cream solder applied onto each wiring pattern of the printed circuit board remains the same regardless of the lengths of the wiring patterns.

4. The board according to claim 1, wherein the wiring patterns have an equal dimension in the pitch direction of the terminals of the component.

5. The board according to claim 4, wherein the dimensions of the wiring patterns in the direction perpendicular to the pitch direction are determined by multiplying a sum of warpage values of the component and the printed circuit board by a proportionality coefficient which reflects a composition of solder, a height of cream solder, and a width of each wiring pattern.

6. The board according to claim 1, wherein the wiring patterns for the terminals near each end portion of the component respectively have a wider dimension in the pitch direction than that of the wiring patterns for the terminals near the central portion of the component, and a product of a width of each wiring pattern in the pitch direction of the component and a length of each wiring pattern in the direction perpendicular to the pitch direction is changed in accordance with a sum of warpage values of the component and the printed circuit board.

7. A method of mounting a component having a plurality of terminals on a printed circuit board by using a reflow soldering process, comprising:
forming, on a printed circuit board, wiring patterns on which the component is to be mounted, that are arranged in correspondence with the plurality of terminals and have a size which is smaller in wiring patterns for terminals near a central portion of the component than in wiring patterns for terminals near each end portion of the component;
applying cream solder onto respective wiring patterns of the printed circuit board in an equal amount regardless of the sizes of the respective wiring patterns; and melting the cream solder by using a reflow soldering process to mount the component on the printed circuit board,
wherein the wiring patterns for the terminals near each end portion of the component respectively have a larger dimension in a direction perpendicular to a pitch direction than that of the wiring patterns for the terminals near the central portion of the component.

* * * * *